(12) United States Patent
Xu

(10) Patent No.: US 9,093,329 B2
(45) Date of Patent: Jul. 28, 2015

(54) ARRAY SUBSTRATE AND FABRICATION METHOD THEREOF, AND LIQUID CRYSTAL DISPLAY DEVICE

(71) Applicant: BEIJING BOE OPTOELECTRONICS TECHNOLOGY CO., LTD., Beijing (CN)

(72) Inventor: Rui Xu, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/106,948

(22) Filed: Dec. 16, 2013

(65) Prior Publication Data

US 2014/0210006 A1    Jul. 31, 2014

(30) Foreign Application Priority Data

Jan. 25, 2013    (CN) .......................... 2013 1 0030582

(51) Int. Cl.
H01L 27/12    (2006.01)

(52) U.S. Cl.
CPC ........ H01L 27/1251 (2013.01); H01L 27/1288 (2013.01)

(58) Field of Classification Search
CPC .............. H01L 27/124; H01L 27/3232; H01L 27/14605; H01L 27/14609; H01L 27/14647; H01L 27/14812; H01L 27/3211; H01L 27/43218; H01L 27/3248; H01L 27/326; H01L 27/1251
See application file for complete search history.

(56) References Cited

U.S. PATENT DOCUMENTS

| | | | |
|---|---|---|---|
| 2005/0253531 A1* | 11/2005 | Matsumoto et al. | 315/169.3 |
| 2007/0285369 A1* | 12/2007 | Park et al. | 345/90 |
| 2008/0303969 A1* | 12/2008 | Chen et al. | 349/46 |
| 2009/0115953 A1* | 5/2009 | Kim et al. | 349/153 |
| 2011/0175893 A1* | 7/2011 | Machida et al. | 345/212 |
| 2012/0033163 A1* | 2/2012 | Qin | 349/106 |
| 2012/0169985 A1* | 7/2012 | Kim et al. | 349/139 |

* cited by examiner

*Primary Examiner* — Wael Fahmy
*Assistant Examiner* — Wasiul Haider

(57) ABSTRACT

Embodiments of the invention provide an array substrate and a fabrication method thereof, and a liquid crystal display device. The array substrate comprises: a gate line, a data line, and a pixel unit formed by the gate line and the data line intersecting with each other. A first thin-film transistor and a pixel electrode are formed in the pixel unit, and the pixel electrode has slits. The pixel unit further comprises a second thin-film transistor, a first common electrode and a second common electrode, and the second thin-film transistor is configured to turn on and transmit a signal of the first common electrode to the second common electrode when a data line signal is at a high level.

14 Claims, 12 Drawing Sheets

ARRAY SUBSTRATE AND FABRICATION METHOD THEREOF, AND LIQUID CRYSTAL DISPLAY DEVICE

CROSS REFERENCE TO RELATED APPLICATIONS

This application claims priority from Chinese National Application No. 201310030582.3 filed on Jan. 25, 2013, the contents of which are incorporated herein by reference.

TECHNICAL FIELD

Embodiments of the invention relate to an array substrate and a fabrication method thereof, and a liquid crystal display device.

BACKGROUND

Nowadays, an ultrahigh resolution and high pixel density (PPI) technology is employed to achieve a vivid display effect. 300 PPI is a maximum resolution that can be identified by human eyes. If the pixel density of a display device exceeds 300 PPI, human eyes would not distinguish individual pixels and no longer have granular sensation, so that the display device with such resolution is close to a paper product for human eyes. Since the resolution has gone beyond the maximum resolution that can be identified by human eyes, the high PPI technology is also called as a retina display technology. However, high PPI technology presents a challenge to pixel design, and it is required to ensure the overall display effect of the display device while maintaining the transmittance of each pixel. The uniformity of a common electrode signal of the display device has a significant influence on the flicker and crosstalk and so on. The larger the display device is, the greater effect of the stability of the common electrode signal on the overall display effect is.

In a conventional array substrate, each pixel unit only comprises one Thin-Film Transistor (TFT), and an Integrated Circuit (IC) only provides one common electrode voltage. As shown in FIG. 1, at the moments of turning on and off the data line signal voltage (curve A), the common electrode voltage (curve B) fluctuates due to the influence of the data line signal voltage (the circled area in FIG. 1). That is, the common electrode voltage is increased or decreased by about 0.5V by the data line signal voltage. Unstable common electrode voltage will result in the flicker of the display device.

SUMMARY

In one aspect, an embodiment of the invention provides an array substrate. The array substrate comprises: a gate line, a data line, and a pixel unit formed by the gate line and the data line intersecting with each other. A first thin-film transistor and a pixel electrode are formed in the pixel unit, and the pixel electrode has slits. The pixel unit further comprises a second thin-film transistor, a first common electrode and a second common electrode, and the second thin-film transistor is configured to turn on and transmit a signal of the first common electrode to the second common electrode when a data line signal is at a high level.

For example, a gate electrode of the second thin-film transistor and the data line are provided in a same layer and connected to each other, and the first common electrode and the second common electrode also serve as a source electrode and a drain electrode of the second thin-film transistor, respectively.

For example, a gate electrode of the first thin-film transistor and the gate line are provided in a same layer and connected to each other, a source electrode and a drain electrode of the first thin-film transistor and the data line are provided in a same layer, the source electrode of the first thin-film transistor is connected with the data line, a channel is formed between the source electrode and the drain electrode of the first thin-film transistor, and the drain electrode of the first thin-film transistor is not connected with the data line.

For example, the array substrate comprises: the gate line and a gate electrode of the first thin-film transistor, formed on a substrate; a gate insulating layer, covering the gate line, the gate electrode of the first thin-film transistor and the substrate; the first common electrode, formed on the gate insulating layer; a first passivation layer, covering the gate insulating layer and the first common electrode; the second common electrode, formed on the first passivation layer; active layers, comprising an active layer of the first thin-film transistor and an active layer of the second thin-film transistor, wherein the active layer of the first thin-film transistor is formed on the first passivation layer and corresponds to the gate electrode of the first thin-film transistor, and the active layer of the second thin-film transistor is formed on the second common electrode and extends in a direction of the data line; a second passivation layer, covering the active layer of the second thin-film transistor; the data line, the gate electrode of the second thin-film transistor and a source electrode and a drain electrode of the first thin-film transistor, wherein the data line is formed on the first passivation layer, the source electrode and the drain electrode of the first thin-film transistor are formed on the active layer of the first thin-film transistor and provided in a same layer as the data line, a channel is formed between the source electrode and the drain electrode of the first thin-film transistor; a third passivation layer, covering the data line, the gate electrode of the second thin-film transistor, the source electrode and the drain electrode of the first thin-film transistor, the second common electrode, the active layers and the first passivation layer; and the pixel electrode, formed on the third passivation layer. A first via hole is formed in the first passivation layer, the first via hole is filled with the active layer of the second thin-film transistor, the first common electrode and the second common electrode are connected through the active layer in the first via hole; a second via hole is formed in the third passivation layer, and the drain electrode of the second thin-film transistor and the pixel electrode are connected through the second via hole.

For example, the gate line has a thickness of 200-400 nm, and the gate insulating layer has a thickness of 300-500 nm.

For example, the first common electrode has a thickness of 30-70 nm, the first passivation layer has a thickness of 300-600nm, the active layers have a thickness of 140-300 nm, and the second common electrode has a thickness of 300-500 nm.

For example, a width to length ratio of a channel of the second thin-film transistor is 0.5 to 1.

For example, the gate electrode of the second thin-film transistor is a part of the data line.

In another aspect, an embodiment of the invention further provides a fabrication method of an array substrate. The method comprises: forming a gate line and a data line on a substrate so that the gate line and the data line intersect with each other to form a pixel unit. A first thin-film transistor and a pixel electrode are formed in the pixel unit, and the pixel electrode having slits. The fabrication method further comprises: forming a second thin-film transistor, a first common electrode and a second common electrode in the pixel unit. The second thin-film transistor is configured to turn on and transmit a signal of the first common electrode to the second common electrode when a data line signal is at a high level.

For example, a gate electrode of the second thin-film transistor and the data line are provided in a same layer and connected to each other, and the first common electrode and the second common electrode also serve as a source electrode and a drain electrode of the second thin-film transistor, respectively.

For example, the fabrication method comprises: step 1: depositing a metal layer on the substrate, and performing a patterning process using a first mask to form a first layer pattern comprising the gate line and a gate electrode of the first thin-film transistor; step 2: depositing a gate insulating layer on the substrate, so that the gate insulating layer covers the gate line, the gate electrode of the first thin-film transistor and the substrate; step 3: depositing a first common electrode layer on the substrate, and performing a patterning process using a second mask to form a second layer pattern comprising the first common electrode, so that the first common electrode is formed on the gate insulating layer; step 4: depositing a passivation layer on the substrate, and performing a patterning process using a third mask to form a third layer pattern comprising a first passivation layer, so that the first passivation layer covers the gate insulating layer and the first common electrode and a first via hole is formed in the first passivation layer; step 5: depositing a second common electrode layer on the substrate, and performing a patterning process using a fourth mask to form a fourth layer pattern comprising the second common electrode, so that the second common electrode is formed on the first passivation layer; step 6: depositing a layer for forming active layers on the substrate, and performing a patterning process using a fifth mask to form a fifth layer pattern comprising the active layers, wherein the active layers comprise an active layer of the first thin-film transistor and an active layer of the second thin-film transistor, the active layer of the first thin-film transistor is formed on the first passivation layer and corresponds to the gate electrode of the first thin-film transistor, the active layer of the second thin-film transistor is formed on the second common electrode and extends in a direction of the data line, the first via hole is filled with the active layer of the second thin-film transistor, and the first common electrode and the second common electrode are connected through the active layer in the first via hole; step 7: depositing a passivation layer on the substrate, and performing a patterning process using a sixth mask to form a sixth layer pattern comprising a second passivation layer, so that the second passivation layer covers the active layer of the second thin-film transistor; step 8: depositing a data line metal layer on the substrate, and performing a patterning process using a seventh mask to form a seventh layer pattern comprising the data line, the gate electrode of the second thin-film transistor and a source electrode and a drain electrode of the first thin-film transistor, so that the data line is formed on the first passivation layer, the source electrode and the drain electrode of the first thin-film transistor are formed on the active layer of the first thin-film transistor and provided in a same layer as the data line, and a channel is formed between the source electrode and the drain electrode of the first thin-film transistor; step 9: depositing a passivation layer on the substrate, and performing a patterning process using an eighth mask to form an eighth layer pattern comprising a third passivation layer, so that the third passivation layer covers the data line, the gate electrode of the second thin-film transistor, the source electrode and the drain electrode of the first thin-film transistor, the second common electrode, the active layers and the first passivation layer, and a second via hole is formed in the third passivation layer; and step 10: depositing a pixel electrode layer on the substrate, and performing a patterning process using a ninth mask to form a ninth layer pattern comprising the pixel electrode, so that the pixel electrode is formed on the third passivation layer, and the pixel electrode is connected with the drain electrode of the first thin-film transistor through the second via hole.

In yet another aspect, an embodiment of the invention further provides a liquid crystal display device, and the liquid crystal display device comprises the array substrate as described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
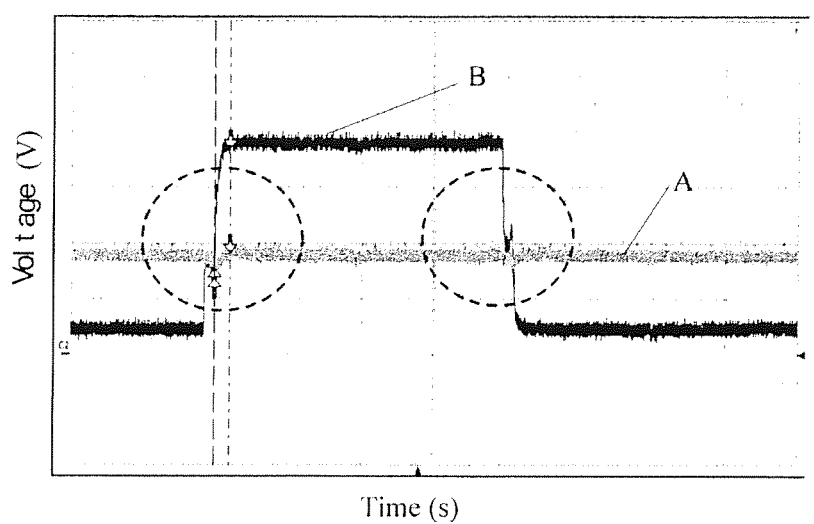
FIG. 1 is a graph illustrating how a common electrode voltage and a data line signal voltage change with time in a conventional array substrate.
Figure 2:
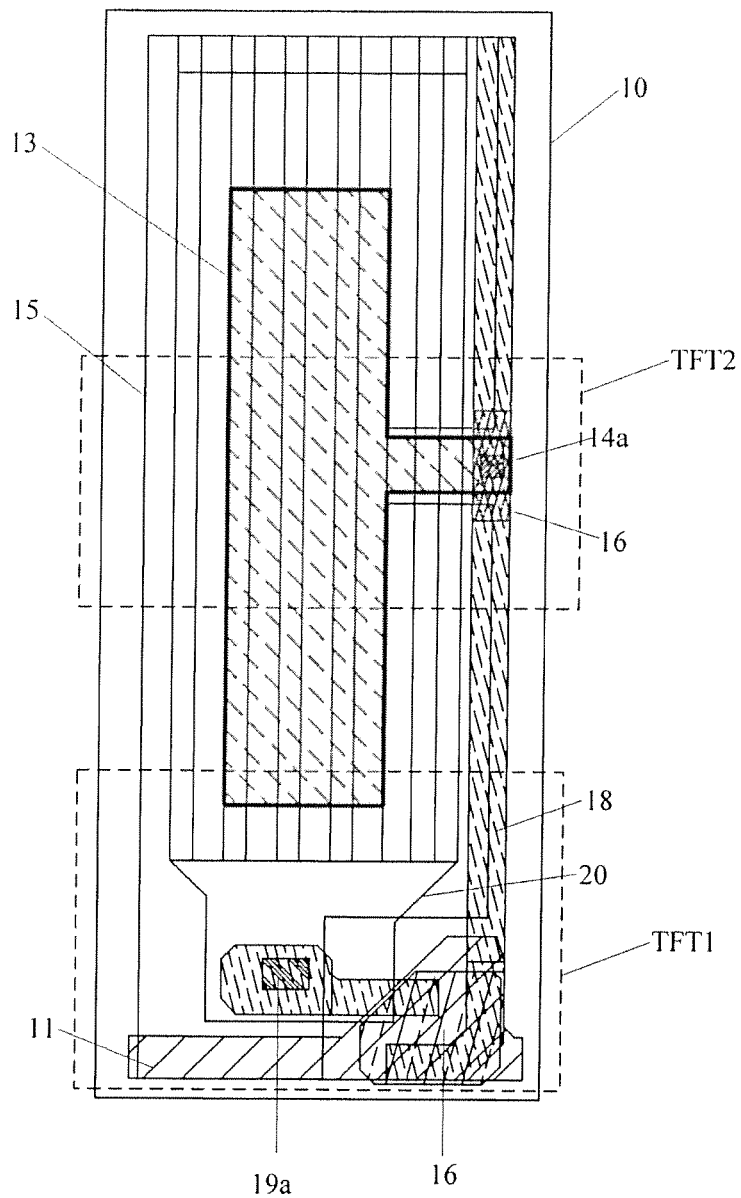
FIG. 2 is a plan view illustrating an array substrate according to an embodiment of the invention.

An embodiment of the invention provides an array substrate. FIG. 2 is a plan view of the array substrate according to the embodiment of the invention. As shown in FIG. 2, the array substrate according to the embodiment of the invention comprises: a gate line 11, a data line 18, and a pixel unit formed by the gate line 11 and the data line 18 intersecting with each other. A first thin-film transistor TFT1 and a second thin-film transistor TFT2 are formed in the pixel unit. It should be noted that the following descriptions are made based on a single pixel unit in the embodiment of the invention, but other pixel units can be formed in the same manner. Here, the "pixel unit" refers to a minimum unit for image display, and for example, the pixel unit is one of red, green and blue pixel units.

Figure 11:
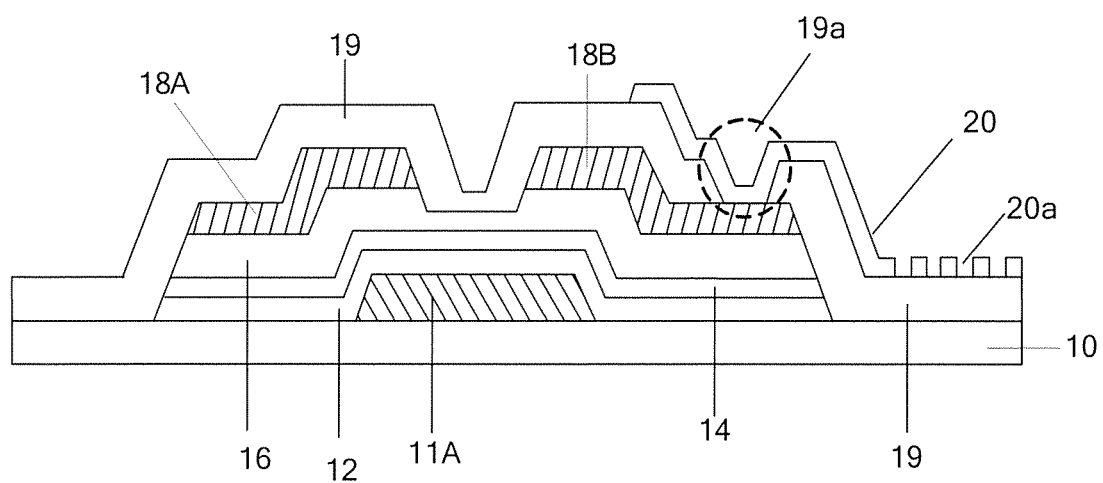
FIG. 11 is a cross-sectional view illustrating the first thin-film transistor in the array substrate according to the embodiment of the invention.
Figure 12:
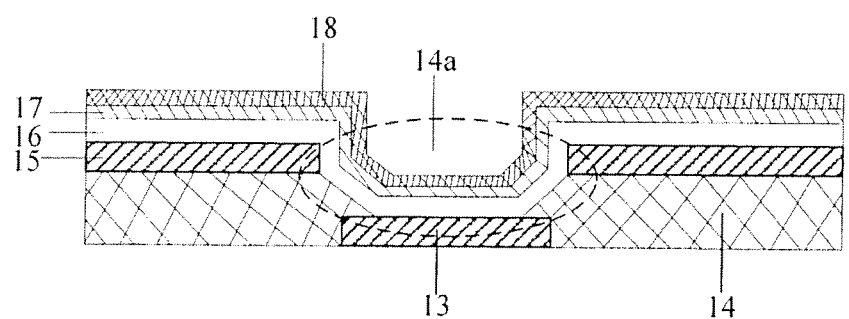
FIG. 12 is a cross-sectional view illustrating the second thin-film transistor in the array substrate according to the embodiment of the invention.

FIG. 11 is a cross-sectional view of the first thin-film transistor in the array substrate according to the embodiment of the invention, and FIG. 12 is a cross-sectional view of the second thin-film transistor in the array substrate according to the embodiment of the invention. As shown in FIG. 11 and FIG. 12, the array substrate according to the embodiment of the invention comprises: a substrate 10; the gate line 11 and a gate electrode 11A of the first thin-film transistor (refer to FIG. 11); a gate insulating layer 12; a first common electrode 13; a first passivation layer 14 (refer to FIG. 11 and FIG. 12); a second common electrode 15; active layers 16; a second passivation layer 17 (refer to FIG. 12); the data line 18, a source electrode 18A and a drain electrode 18B (refer to FIG. 11) of the first thin-film transistor and a gate electrode of the second thin-film transistor; a third passivation layer 19 (refer to FIG. 11); and a pixel electrode 20. The gate line 11 and the gate electrode 11A of the first thin-film transistor are formed on the substrate 10, and the gate line 11 and the gate electrode 11A of the first thin-film transistor are formed in a same layer and connected to each other. The gate insulating layer 12 covers the gate line 11, the gate electrode 11A of the first thin-film transistor and the substrate 10. The first common electrode 13 is formed on the gate insulating layer 12. The first passivation layer 14 covers the gate insulating layer 12 and the first common electrode 13. The second common electrode 15 is formed on the first passivation layer 14. The active layers 16 comprise an active layer of the first thin-film transistor TFT1 and an active layer of the second thin-film transistor TFT2, the active layer of the first thin-film transistor TFT1 is formed on the first passivation layer 14 and corresponds to the gate electrode 11A of the first thin-film transistor TFT1, and the active layer of the second thin-film transistor TFT2 is formed on the second common electrode 15 and extends in a direction of the data line 18. The second passivation layer 17 covers the active layer 16 of the second thin-film transistor TFT2. The data line 18 is formed on the first passivation layer 14. The source electrode 18A and the drain electrode 18B of the first thin-film transistor are formed on the active layer 16 of the first thin-film transistor TFT1 and in the same layer as the data line 18, a channel is formed between the source electrode 18A and the drain electrode 18B of the first thin-film transistor, the data line 18 is connected with the source electrode 18A of the first thin-film transistor but is not connected with the drain electrode 18B of the first thin-film transistor. It should be noted here that the data line 18 may cover part or entire of the second common electrode 15 or do not cover the second common electrode 15, and the drawings show a case that the data line 18 covers part of the second common electrode 15 as an example. The third passivation layer 19 covers the data line 18, the gate electrode of the second thin-film transistor, the source electrode 18A and the drain electrode 18B of the first thin-film transistor, the second common electrode 15, the active layers 16 and the first passivation layer 14. The pixel electrode 20 is formed on the third passivation layer 19 and has slits 20a. A first via hole 14a is formed in the first passivation layer 14, and the first via hole 14a is filled with the active layer 16 of the second thin-film transistor TFT2, so that the first common electrode 13 is connected with the second common electrode 15 through the active layer 16 in the first via hole 14a, as shown in FIG. 12. It should be noted that FIG. 12 merely exemplarily shows the structures and shapes of the first common electrode 13, the second common electrode 15 and the first via hole 14a; however, the structures and shapes of the first common electrode 13, the second common electrode 15 and the first via hole 14a in the array substrate according to the embodiment of the invention are not limited thereto, and the first common electrode 13, the second common electrode 15 and the first via hole 14a may have other structures and shapes depending on the practical situations. The first common electrode 13 is provided with a first common electrode voltage and also serves as a source electrode of the second thin-film transistor TFT2. The second common 15 is provided with a second common electrode voltage and also serves as a drain electrode of the second thin-film transistor TFT2. The first common electrode voltage and the second common electrode voltage are respectively supplied by an Integrated Circuit (IC). The gate electrode of the second thin-film transistor TFT2 and the data line 18 are formed in a same layer and connected to each other. For example, the gate electrode of the second thin-film transistor TFT2 is a part of the data line 18. A second via hole 19a is formed in the third passivation layer 19, so that the drain electrode 18B of the first thin-film transistor is connected with the pixel electrode 20 through the second via hole 19a. The second via hole 19a is provided at the drain electrode of the first thin-film transistor TFT1.

For example, the gate line has a thickness of 200-400 nm; the gate insulating layer has a thickness of 300-500 nm; the first common electrode has a thickness of 30-70 nm; the first passivation layer has a thickness of 300-600 nm; the active layers have a thickness of 140-300 nm; and the second common electrode has a thickness of 300-500 nm.

Figure 13:
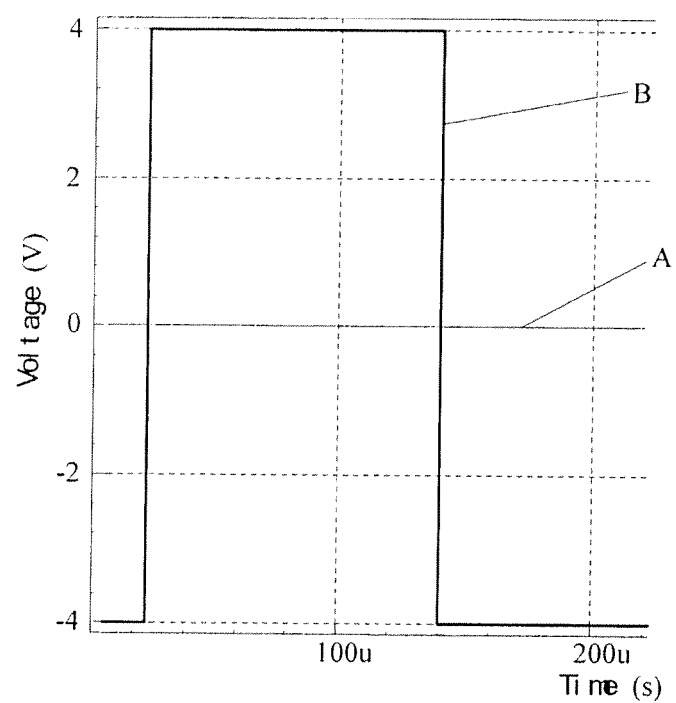
FIG. 13 is a graph showing how a common electrode voltage and a data line signal voltage change with time in the array substrate according to the embodiment of the invention.

In the array substrate according to the embodiment of the invention, two thin-film transistors are formed in a same pixel unit, i.e., the first thin-film transistor and the second thin-film transistor are formed in the same pixel unit. FIG. 11 is a cross-sectional view of the first thin-film transistor TFT1, the first thin-film transistor is a normal thin-film transistor (TFT1 shown in FIG. 2), the gate electrode 11A of the first thin-film transistor and the gate line 11 are provided in the same layer and connected to each other, the source electrode 18A and the drain electrode 18B of the first thin-film transistor are provided in the same layer as the data line 18, and the data line 18 is connected to the source 18A but is not connected to the drain electrode 18B. In addition, an additional thin-film transistor, i.e., the second thin-film transistor TFT2 (TFT2 shown in FIG. 2) is formed in the array substrate according to the embodiment of the invention, and FIG. 12 is a cross-sectional view of the second thin-film transistor. The second thin-film transistor TFT2 has a top gate structure, the first common electrode 13 and the second common electrode 15 respectively form the source electrode and the drain electrode of the second thin-film transistor TFT2, the data line 18 and the gate electrode of the second thin-film transistor TFT2 are provided in the same layer, and the gate electrode of the second thin-film transistor is connected with the data line 18. Since the second thin-film transistor TFT2 is a compensation design for the common electrode signal, a width to length ratio (w/l) of a channel of the second thin-film transistor may be designed to be a larger value, so that a larger ON current is obtained and the charging speed is increased. The w/l of the channel of the second thin-film transistor is about 0.5 to 1. When the data line signal is at a low voltage (for example, the low voltage range is −4v~0v), the second thin-film transistor TFT2 is not turned on, the common electrode voltage is supplied by the second common electrode 15, and generally the common electrode voltage is between 0V and the voltage difference of the data line signal. When the data line signal is at a high voltage (for example, the high voltage is 0~8v), the second thin-film transistor TFT2 is turned on, the first common electrode 13 and the second common electrode 15 are electrically connected with each other, the signal of the first common electrode 13 transmits to the second common electrode 15, and thus the first common electrode 13 can compensate the fluctuation of the second common electrode voltage caused by the reversion of the data line signal so as to maintain a stable output of the common electrode voltage. The first common electrode voltage and the second common electrode voltage are respectively supplied by the Integrated Circuit (IC). For example, the common voltage magnitude of the first common electrode is −0.5v~0v. FIG. 13 is a graph showing how the common electrode voltage and the data line signal voltage change with the time in the array substrate according to the embodiment of the invention. As shown in FIG. 13, in the array substrate according to the embodiment of the invention, at the moments of turning on and off the data line signal (curve B), the common electrode voltage (curve A) does not fluctuate. Since the second thin-film transistor can compensate the fluctuation of the second common electrode voltage caused by the reversion of the data line signal, the common electrode voltage can be stably output, and thereby the overall display effect of the display device can be improved.

In addition, an embodiment of the invention provides a fabrication method of an array substrate. In the array substrate, a same pixel unit comprises a first thin-film transistor and a second thin-film transistor. The fabrication method comprises: forming a gate line, a gate electrode of the first thin-film transistor, a gate insulating layer, a first common electrode, a first passivation layer, a second common electrode, active layers, a second passivation layer, a data line, a gate electrode of the second thin-film transistor, a source electrode and a drain electrode of the first thin-film transistor, a third passivation layer and a pixel electrode on a substrate. The gate electrode of the first thin-film transistor and the gate line are provided in a same layer and connected to each other. The source electrode and the drain electrode of the first thin-film transistor are provided in a same layer as the data line, and the data line is connected with the source electrode of the first thin-film transistor but is not connected to the drain electrode of the first thin-film transistor. The data line and the gate electrode of the second thin-film transistor are provided in a same layer and connected to each other. The first common electrode and the second common electrode also serve as the source electrode and the drain electrode of the second thin-film transistor, respectively.

Hereinafter, the fabrication method of the array substrate according to the embodiment of the invention will be specifically described in conjunction with the accompanying drawings. The fabrication method of the array substrate according to the embodiment of the invention may comprise the following steps.

Figure 3:
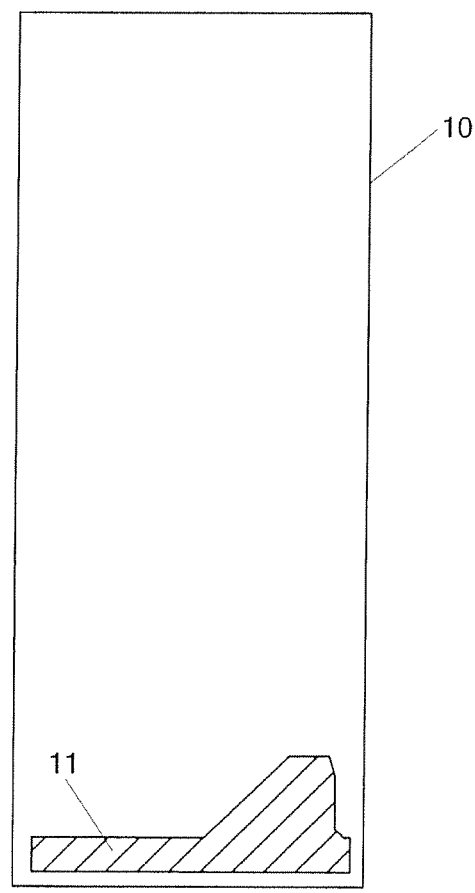
FIG. 3 is a plan view after a gate line and a gate electrode of a first thin-film transistor are formed in a fabrication method of an array substrate according to an embodiment of the invention.

Step 1: A metal layer is deposited on the substrate 10, and a patterning process is performed using a first mask to form a first layer pattern comprising the gate line 11 and the gate electrode 11A of the first thin-film transistor, as shown in FIG. 3 and FIG. 11. For example, the gate line has a thickness of 200-400 nm.

Step 2: The gate insulating layer 12 is deposited on the substrate 10 that has underwent the step 1 so that the gate insulating layer 12 covers the gate line 11, the gate electrode 11A of the first thin-film transistor and the substrate 10. For example, the gate insulating layer has a thickness of 300-500 nm.

Figure 4:
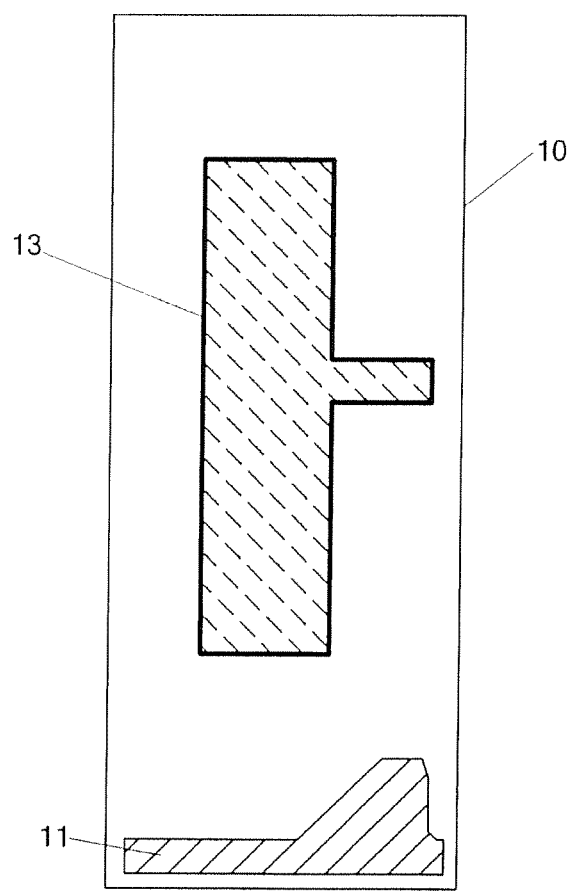
FIG. 4 is a plan view after a first common electrode is formed in the fabrication method of the array substrate according to the embodiment of the invention.

Step 3: A first common electrode layer is deposited on the substrate 10 that has underwent the step 2, a patterning process is performed using a second mask to form a second layer pattern comprising the first common electrode 13, and the first common electrode 13 is formed on the gate insulating layer 12, as shown in FIG. 4. The first common electrode also serves as the source electrode of the second thin-film transistor. For example, the first common electrode has a thickness of 30-70 nm.

Figure 5:
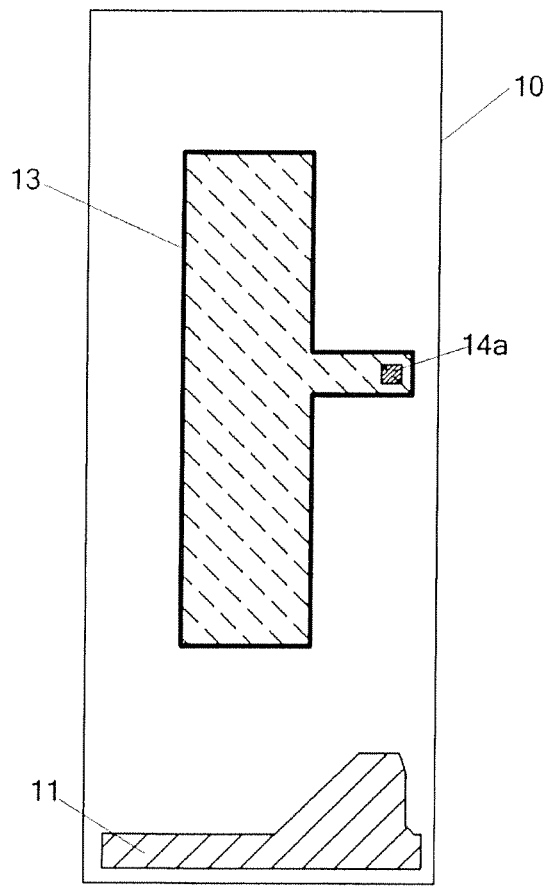
FIG. 5 is a plan view after a first passivation layer is formed in the fabrication method of the array substrate according to the embodiment of the invention.

Step 4: A passivation layer is deposited on the substrate 10 that has underwent the step 3, a patterning process is performed using a third mask to form a third layer pattern comprising the first passivation layer 14, the first passivation layer 14 covers the gate insulating layer 12 and the first common electrode 13, and a first via hole 14a is formed in the first passivation layer 14, as shown in FIG. 5. For example, the first passivation layer has a thickness of 300-600 nm.

Figure 6:
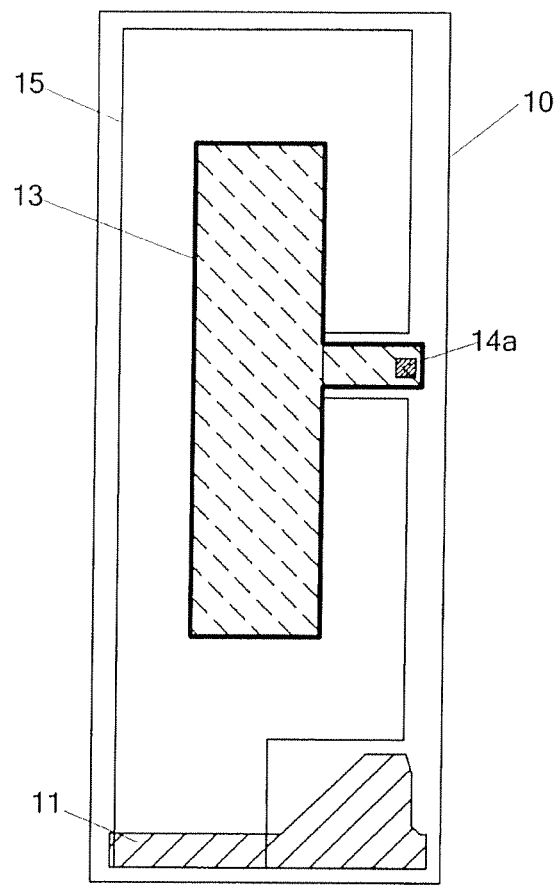
FIG. 6 is a plan view after a second common electrode is formed in the fabrication method of the array substrate according to the embodiment of the invention.

Step 5: A second common electrode layer is deposited on the substrate 10 that has underwent the step 4, a patterning process is performed using a fourth mask to form a fourth layer pattern comprising the second common electrode 15, and the second common electrode 15 is formed on the first passivation layer 14, as shown in FIG. 6. The second common electrode also serves as the drain electrode of the second thin-film transistor. For example, the second common electrode has a thickness of 300-500 nm.

Figure 7:
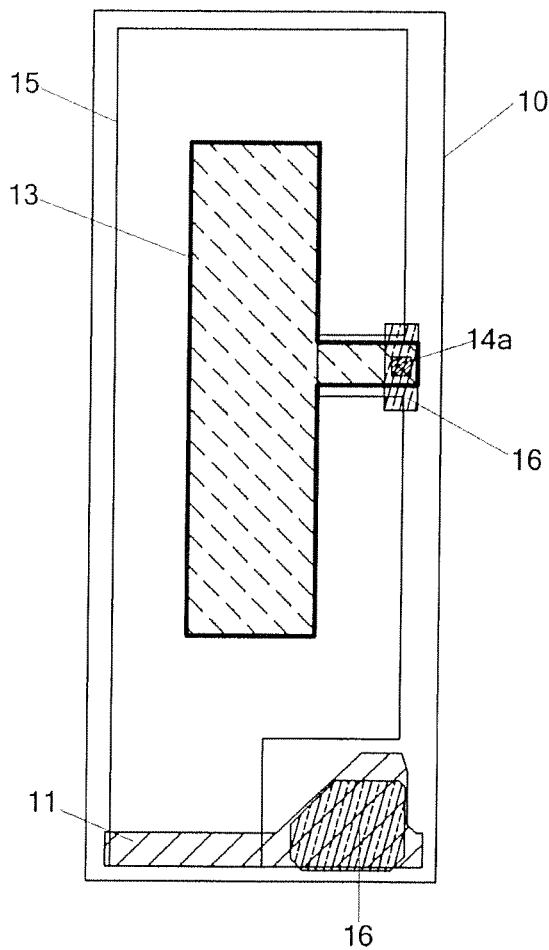
FIG. 7 is a plan view after active layers are formed in the fabrication method of the array substrate according to the embodiment of the invention.

Step 6: A layer for forming active layers are deposited on the substrate 10 that has underwent the step 5, and a patterning process is performed using a fifth mask to form a fifth layer pattern comprising the active layers 16. The active layers 16 comprise an active layer of the first thin-film transistor TFT1 and an active layer of the second thin-film transistor TFT2, the active layer of the first thin-film transistor TFT1 is formed on the first passivation layer 14 and corresponds to the gate electrode 11A of the first thin-film transistor TFT1, and the active layer of the second thin-film transistor TFT2 is formed on the second common electrode 15 and extends in a direction of the data line 18. The first via hole 14a is filled with the active layer 16 of the second thin-film transistor, and the first common electrode 13 is connected with the second common electrode 15 through the active layer 16 in the first via hole 14a, as shown in FIG. 7. For example, the active layers have a thickness of 140-300 nm.

Step 7: A passivation layer is deposited on the substrate 10 that has underwent the step 6, a patterning process is performed using a sixth mask to form a sixth layer pattern comprising the second passivation layer 17, and the second passivation layer 17 covers the active layer of the second thin-film transistor 16, as shown in FIG. 12.

Figure 8:
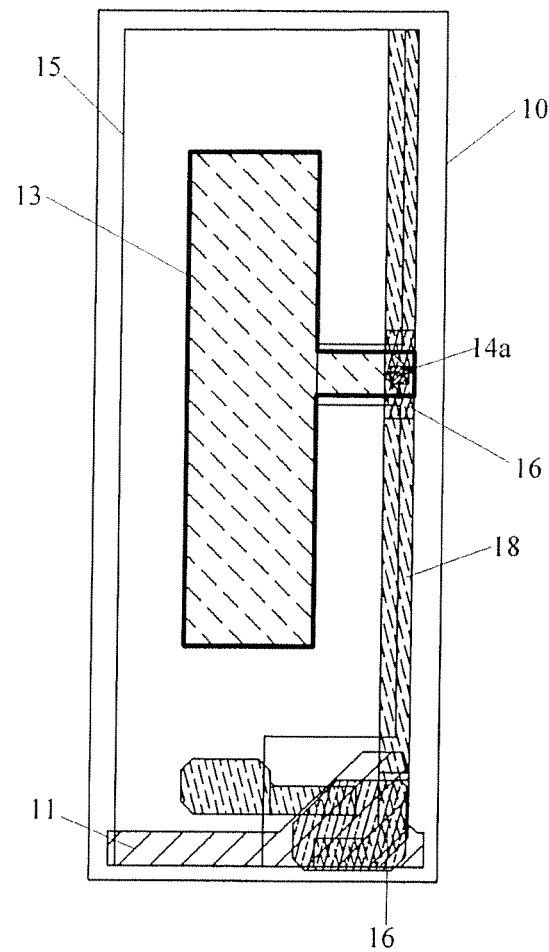
FIG. 8 is a plan view after a data line, a source electrode and a drain electrode of the first thin-film transistor and a gate electrode of a second thin-film transistor are formed in the fabrication method of the array substrate according to the embodiment of the invention.

Step 8: A data line metal layer is deposited on the substrate 10 that has underwent the step 7, a patterning process is performed using a seventh mask to form a seventh layer pattern comprising the data line 18, the gate electrode of the second thin-film transistor, and the source electrode 18A and the drain electrode 18B of the first thin-film transistor. The data line is formed on the first passivation layer 14. The source electrode 18A and the drain electrode 18B of the first thin-film transistor are formed on the active layer 16 of the first thin-film transistor and provided in the same layer as the data line 18, and a channel is formed between the source electrode 18A and the drain electrode 18B of the first thin-film transistor. It should be noted that the data line 18 may cover part or entire of the second common electrode 15 or do not cover the second common electrode 15, and the drawings show a case that the data line 18 covers part of the second common electrode 15 as an example. The data line and the source and drain electrodes of the first thin-film transistor are provided in the same layer, and the source electrode of the first thin-film transistor is connected with the data line. The channel is formed between the source electrode and the drain electrode, and the drain electrode of the first thin-film transistor is not connected to the data line. The gate electrode of the second thin-film transistor and the data line are provided in the same layer and connected to each other. For example, the gate electrode of the second thin-film transistor is a part of the data line. At the channel of the first thin-film transistor, the data line layer has been totally etched away, and a portion of the active layer is also etched away, as shown in FIG. 8 and FIG. 11.

Figure 9:
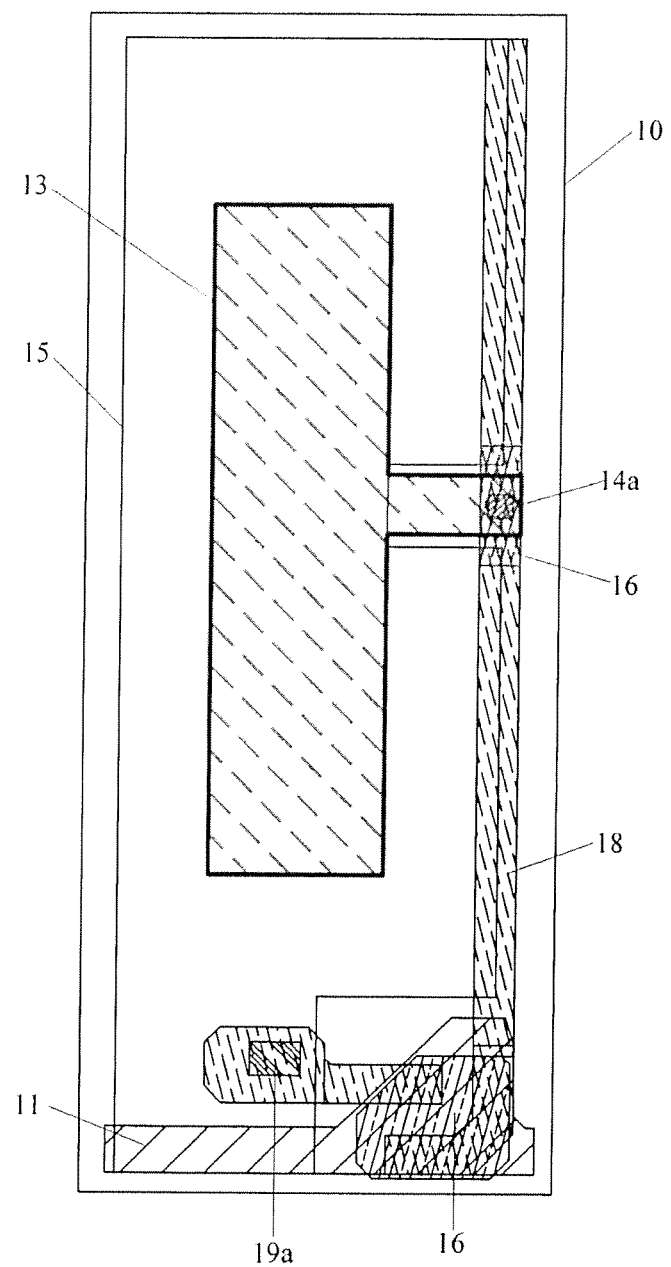
FIG. 9 is a plan view after a third passivation layer is formed in the fabrication method of the array substrate according to the embodiment of the invention.

Step 9: A passivation layer is deposited on the substrate 10 that has underwent the step 8, a patterning process is performed using an eighth mask to form an eighth layer pattern comprising the third passivation layer 19, and the third passivation layer 19 covers the data line 18, the gate electrode of the second thin-film transistor, the source electrode 18A and the drain electrode 18B of the first thin-film transistor, the second common electrode 15, the active layers 16 and the first passivation layer 14. A second via hole 19a is formed in the third passivation layer 19, and the second via hole 19a is located at the drain electrode of the first thin-film transistor, as shown in FIG. 9.

Figure 10:
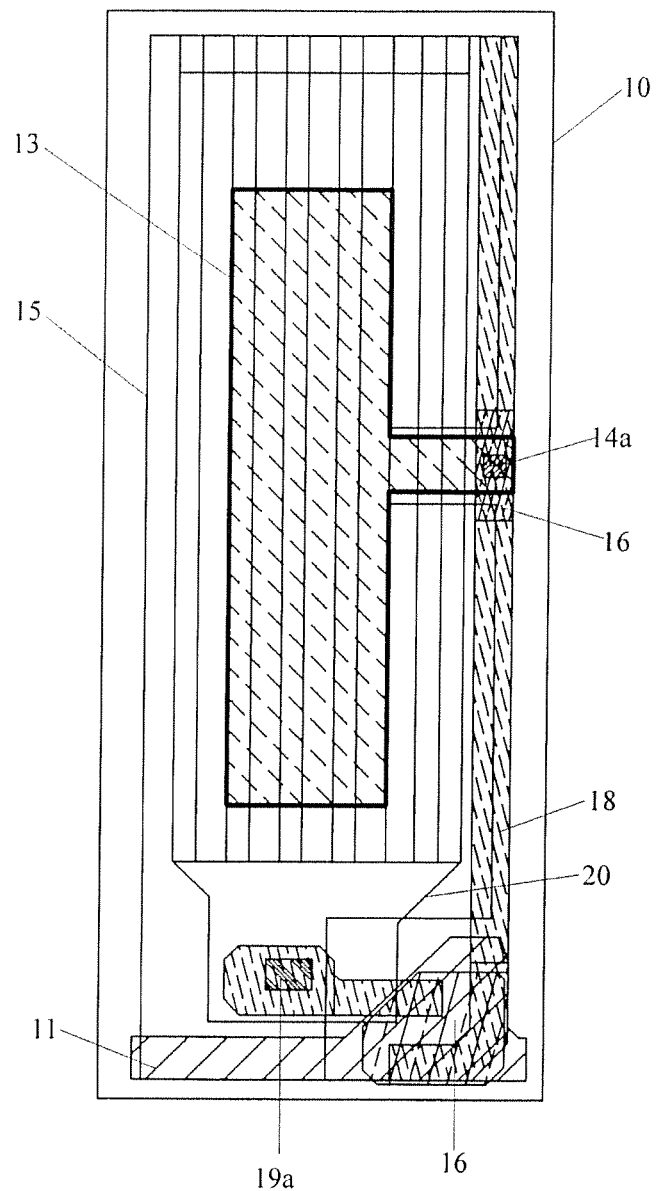
FIG. 10 is a plan view after a pixel electrode is formed in the fabrication method of the array substrate according to the embodiment of the invention.

Step 10: A pixel electrode layer is deposited on the substrate 10 that has underwent the step 9, a patterning process is performed using a ninth mask to form a ninth layer pattern comprising the pixel electrode 20, and the pixel electrode 20 is connected with the drain electrode 18B of the first thin-film transistor through the second via hole 19a, as shown in FIG. 10.

In the above steps 1-10, the patterning process may comprise the processes of exposure, development, etching, stripping and the like that are commonly used in the art.

In addition, an embodiment of the invention provides a liquid crystal display device. The liquid crystal display device comprises the array substrate as described above.

The embodiment of the invention employs nine patterning processes to fabricate the array substrate, and the second thin-film transistor with a top gate structure is introduced based on the conventional array substrate. The first common electrode and the second common electrode serve as the source electrode and the drain electrode of the second thin-film transistor, respectively. The gate electrode of the second thin-film transistor and the data line are provided in the same layer and connected to each other. When a data line signal or other signal is applied, the second thin-film transistor is turned on, and thus the influence on the common electrode voltage caused by the variation of data line signal or other signal can be eliminated. Therefore, the second thin-film transistor can compensate the fluctuation of the common electrode voltage caused by the reversion of data line signal, the common electrode voltage can be stably output, and the overall display effect of the display device can be improved.

It should be noted that the plan views and cross-sections views of respective layers in the array substrate according to the embodiment of the invention are merely illustrative and do not represent the actual dimensions, shapes and scales of respective components of the array substrate.

The foregoing embodiments merely are exemplary embodiments of the invention, and not intended to define the scope of the invention, and the scope of the invention is determined by the appended claims.

What is claimed is:

1. An array substrate, comprising: a gate line, a data line, and a pixel unit formed by the gate line and the data line intersecting with each other, a first thin-film transistor and a pixel electrode being formed in the pixel unit, and the pixel electrode having slits, wherein
the pixel unit further comprises a second thin-film transistor, a first common electrode and a second common electrode, and the second thin-film transistor is configured to turn on and transmit a signal of the first common electrode to the second common electrode when a data line signal is at a high level;
the first common electrode and the second common electrode also serve as a source electrode and a drain electrode of the second thin-film transistor, respectively.

2. The array substrate according to claim 1, wherein a gate electrode of the second thin-film transistor and the data line are provided in a same layer and connected to each other.

3. The array substrate according to claim 2, wherein a gate electrode of the first thin-film transistor and the gate line are provided in a same layer and connected to each other, a source electrode and a drain electrode of the first thin-film transistor and the data line are provided in a same layer, the source electrode of the first thin-film transistor is connected with the data line, a channel is formed between the source electrode and the drain electrode of the first thin-film transistor, and the drain electrode of the first thin-film transistor is not connected with the data line.

4. The array substrate according to claim 2, wherein the array substrate comprises:
the gate line and a gate electrode of the first thin-film transistor, formed on a substrate;
a gate insulating layer, covering the gate line, the gate electrode of the first thin-film transistor and the substrate;
the first common electrode, formed on the gate insulating layer;
a first passivation layer, covering the gate insulating layer and the first common electrode;
the second common electrode, formed on the first passivation layer;
active layers, comprising an active layer of the first thin-film transistor and an active layer of the second thin-film transistor, wherein the active layer of the first thin-film transistor is formed on the first passivation layer and corresponds to the gate electrode of the first thin-film transistor, and the active layer of the second thin-film transistor is formed on the second common electrode and extends in a direction of the data line;
a second passivation layer, covering the active layer of the second thin-film transistor;
the data line, the gate electrode of the second thin-film transistor and a source electrode and a drain electrode of the first thin-film transistor, wherein the data line is formed on the first passivation layer, the source electrode and the drain electrode of the first thin-film transistor are formed on the active layer of the first thin-film transistor and provided in a same layer as the data line, a channel is formed between the source electrode and the drain electrode of the first thin-film transistor;

a third passivation layer, covering the data line, the gate electrode of the second thin-film transistor, the source electrode and the drain electrode of the first thin-film transistor, the second common electrode, the active layers and the first passivation layer; and the pixel electrode, formed on the third passivation layer, wherein a first via hole is formed in the first passivation layer, the first via hole is filled with the active layer of the second thin-film transistor, the first common electrode and the second common electrode are connected through the active layer in the first via hole; a second via hole is formed in the third passivation layer, and the drain electrode of the second thin-film transistor and the pixel electrode are connected through the second via hole.

5. The array substrate according to claim 2, wherein the gate line has a thickness of 200-400 nm, and the gate insulating layer has a thickness of 300-500 nm.

6. The array substrate according to claim 2, wherein the first common electrode has a thickness of 30-70 nm.

7. The array substrate according to claim 2, wherein a width to length ratio of a channel of the second thin-film transistor is 0.5 to 1.

8. The array substrate according to claim 2, wherein the gate electrode of the second thin-film transistor is a part of the data line.

9. A fabrication method of the array substrate, comprising: forming a gate line and a data line on a substrate so that the gate line and the data line intersect with each other to form a pixel unit, a first thin-film transistor and a pixel electrode being formed in the pixel unit, the pixel electrode having slits, wherein the fabrication method further comprises: forming a second thin-film transistor, a first common electrode and a second common electrode in the pixel unit, and the second thin-film transistor is configured to turn on and transmit a signal of the first common electrode to the second common electrode when a data line signal is at a high level;

the first common electrode and the second common electrode also serve as a source electrode and a drain electrode of the second thin-film transistor, respectively.

10. The fabrication method according to claim 9, wherein a gate electrode of the second thin-film transistor and the data line are provided in a same layer and connected to each other, and the first common electrode and the second common electrode also serve as a source electrode and a drain electrode of the second thin-film transistor, respectively.

11. The fabrication method according to claim 10, wherein the fabrication method comprises:

step 1: depositing a metal layer on the substrate, and performing a patterning process using a first mask to form a first layer pattern comprising the gate line and a gate electrode of the first thin-film transistor;

step 2: depositing a gate insulating layer on the substrate, so that the gate insulating layer covers the gate line, the gate electrode of the first thin-film transistor and the substrate;

step 3: depositing a first common electrode layer on the substrate, and performing a patterning process using a second mask to form a second layer pattern comprising the first common electrode, so that the first common electrode is formed on the gate insulating layer;

step 4: depositing a passivation layer on the substrate, and performing a patterning process using a third mask to form a third layer pattern comprising a first passivation layer, so that the first passivation layer covers the gate insulating layer and the first common electrode and a first via hole is formed in the first passivation layer;

step 5: depositing a second common electrode layer on the substrate, and performing a patterning process using a fourth mask to form a fourth layer pattern comprising the second common electrode, so that the second common electrode is formed on the first passivation layer;

step 6: depositing a layer for forming active layers on the substrate, and performing a patterning process using a fifth mask to form a fifth layer pattern comprising the active layers, wherein the active layers comprise an active layer of the first thin-film transistor and an active layer of the second thin-film transistor, the active layer of the first thin-film transistor is formed on the first passivation layer and corresponds to the gate electrode of the first thin-film transistor, the active layer of the second thin-film transistor is formed on the second common electrode and extends in a direction of the data line, the first via hole is filled with the active layer of the second thin-film transistor, and the first common electrode and the second common electrode are connected through the active layer in the first via hole;

step 7: depositing a passivation layer on the substrate, and performing a patterning process using a sixth mask to form a sixth layer pattern comprising a second passivation layer, so that the second passivation layer covers the active layer of the second thin-film transistor;

step 8: depositing a data line metal layer on the substrate, and performing a patterning process using a seventh mask to form a seventh layer pattern comprising the data line, the gate electrode of the second thin-film transistor and a source electrode and a drain electrode of the first thin-film transistor, so that the data line is formed on the first passivation layer, the source electrode and the drain electrode of the first thin-film transistor are formed on the active layer of the first thin-film transistor and provided in a same layer as the data line, and a channel is formed between the source electrode and the drain electrode of the first thin-film transistor;

step 9: depositing a passivation layer on the substrate, and performing a patterning process using an eighth mask to form an eighth layer pattern comprising a third passivation layer, so that the third passivation layer covers the data line, the gate electrode of the second thin-film transistor, the source electrode and the drain electrode of the first thin-film transistor, the second common electrode, the active layers and the first passivation layer, and a second via hole is formed in the third passivation layer; and step 10: depositing a pixel electrode layer on the substrate, and performing a patterning process using a ninth mask to form a ninth layer pattern comprising the pixel electrode, so that the pixel electrode is formed on the third passivation layer, and the pixel electrode is connected with the drain electrode of the first thin-film transistor through the second via hole.

12. A liquid crystal display device, wherein the liquid crystal display device comprises the array substrate according to claim 1.

13. The array substrate according to claim 4, wherein the first passivation layer has a thickness of 300-600 nm, and the active layers have a thickness of 140-300 nm.

14. An array substrate, comprising: a gate line, a data line, and a pixel unit formed by the gate line and the data line intersecting with each other, a first thin-film transistor and a pixel electrode being formed in the pixel unit, and the pixel electrode having slits, wherein the pixel unit further comprises a second thin-film transistor, a first common electrode and a second common electrode, and the second thin-film transistor is configured to turn on and transmit a signal of the first common electrode to the second common electrode when a data line signal is at a high level;

wherein the array substrate comprises:

the gate line and a gate electrode of the first thin-film transistor, formed on a substrate;

a gate insulating layer, covering the gate line, the gate electrode of the first thin-film transistor and the substrate;

the first common electrode, formed on the gate insulating layer;

a first passivation layer, covering the gate insulating layer and the first common electrode;

the second common electrode, formed on the first passivation layer;

active layers, comprising an active layer of the first thin-film transistor and an active layer of the second thin-film transistor, wherein the active layer of the first thin-film transistor is formed on the first passivation layer and corresponds to the gate electrode of the first thin-film transistor, and the active layer of the second thin-film transistor is formed on the second common electrode and extends in a direction of the data line;

a second passivation layer, covering the active layer of the second thin-film transistor;

the data line, the gate electrode of the second thin-film transistor and a source electrode and a drain electrode of the first thin-film transistor, wherein the data line is formed on the first passivation layer, the source electrode and the drain electrode of the first thin-film transistor are formed on the active layer of the first thin-film transistor and provided in a same layer as the data line, a channel is formed between the source electrode and the drain electrode of the first thin-film transistor;

a third passivation layer, covering the data line, the gate electrode of the second thin-film transistor, the source electrode and the drain electrode of the first thin-film transistor, the second common electrode, the active layers and the first passivation layer; and the pixel electrode, formed on the third passivation layer; and wherein a first via hole is formed in the first passivation layer, the first via hole is filled with the active layer of the second thin-film transistor, the first common electrode and the second common electrode are connected through the active layer in the first via hole; a second via hole is formed in the third passivation layer, and the drain electrode of the second thin-film transistor and the pixel electrode are connected through the second via hole.

* * * * *